United States Patent [19]
Demura

[11] Patent Number: 5,616,256
[45] Date of Patent: Apr. 1, 1997

[54] PRINTED WIRING BOARD AND PROCESS FOR PRODUCING THEREOF

[75] Inventor: Akihiro Demura, Ogaki, Japan

[73] Assignee: Ibiden Co., Inc., Japan

[21] Appl. No.: 527,871

[22] Filed: Sep. 14, 1995

Related U.S. Application Data

[63] Continuation-in-part of Ser. No. 344,669, Nov. 22, 1994, Pat. No. 5,493,077.

[30] Foreign Application Priority Data

Nov. 22, 1993 [JP] Japan .................................. 5-315902
Feb. 23, 1994 [JP] Japan .................................. 6-51149

[51] Int. Cl.$^6$ ........................................................ B44C 1/22
[52] U.S. Cl. .................. 216/18; 216/17; 216/19; 216/41; 216/86
[58] Field of Search .................. 216/13, 17, 18, 216/19, 38, 41, 86; 29/852; 427/97; 324/567

[56] References Cited

U.S. PATENT DOCUMENTS

| | | | |
|---|---|---|---|
| 5,113,315 | 5/1992 | Capp et al. .............................. | 361/386 |
| 5,342,999 | 8/1994 | Frei et al. .............................. | 174/266 |
| 5,356,755 | 10/1994 | Matsuda et al. ...................... | 216/18 X |
| 5,387,493 | 2/1995 | Imabayashi et al. .................. | 430/280 |

FOREIGN PATENT DOCUMENTS

| | | |
|---|---|---|
| 2-144988 | 6/1990 | Japan . |
| 4-328894 | 11/1992 | Japan . |
| 5-273760 | 10/1993 | Japan . |

*Primary Examiner*—William Powell
*Attorney, Agent, or Firm*—Rossi & Associates

[57] ABSTRACT

Disclosed is a printed wiring board 1 with a through hole 5 in which a hollow portion 7 wider than both an upper opening 5A and a lower opening 5A is formed, and a solder resist film 9 is formed at the hollow portion 7 so as to firmly adhere to an inner wall of the through hole 5. Thereby, it can prevent the solder resist film 9 from being dropped out from the through hole 5 and electrical check of circuit patterns on the printed wiring board 1 can be efficiently conducted while directly setting a checker pin 13 of a checker into the through hole 5.

6 Claims, 8 Drawing Sheets

PRINTED WIRING BOARD AND PROCESS FOR PRODUCING THEREOF

This is a Division of application Ser. No. 08/344,669, filed Nov. 22, 1994, now U.S. Pat. No. 5,493,077.

BACKGROUND OF THE INVENTION

1. Field of the Invention

The present invention relates to a printed wiring board with a through hole which is blinded by an insulation resin film. In particular, the present invention relates to a printed wiring board with a through hole in which an insulation film is formed in order to blind thereof and to a process for producing such printed wiring board, thereby when electrical check that breaking of circuit patterns ( wires ) or resistance of circuit patterns on the printed wiring board is done by an electrical checker while fixing the printed wiring board on the checker or a fixing table thereof by sucking through a suction device, not only it can be done electrical check by inserting a top of a checker pin of the checker in the through hole, but also it can reliably prevent the insulation film from being dropped out from the through hole.

2. Description of Related Art

In general, after a printed wiring board is produced and before the printed wiring board is forwarded as a product, electrical check for checking whether circuit patterns are broken or resistance values of circuit patterns exist in a range of predetermined designed resistance values is conventionally conducted. Such electrical check of the printed wiring board is done by a check device having a checker pin, the check device being called "checker".

Here, there exist various checkers and recently a checker having a suction device through which the printed wiring board is sucked and fixed onto a predetermined position of the checker or a table thereof with a plurality of suction openings, is widely utilized. In such checker, electrical check of the printed wiring board is conducted by contacting the checker pin to predetermined position in the circuit patterns.

In case that electrical check of a double-sided printed wiring board or a multilayer printed wiring board, both having through holes, is conducted by using the above suction type checker, in order to certainly suck and fix the printed wiring board onto the checker or the table, it is necessary to blind the through holes of the printed wiring board.

When the through holes formed in the printed wiring board are blinded, the through holes are generally blinded by utilizing insulation resin films called "solder resist", because the solder resist is formed on both surfaces of the printed wiring board in the process thereof so as to protect the circuit patterns and to avoid adherence of melt solder to areas of the circuit patterns where solder should not be adhered.

Here, a conventional process for blinding the through holes of a double-sided printed wiring board will be described hereinafter with reference to FIGS. 12 and 13.

First, as shown in FIG. 12, a penetration hole 22 is formed in the double-sided printed wiring board 21 on both surfaces of which circuit patterns ( not shown ) are formed, thereafter a conductive layer 23 is plated and formed around an inner wall 22A of the penetration hole 22 and peripheral portions of both an upper and lower openings 22B, by conducting through hole plating. Thereby, a through hole 24 is formed in the printed wiring board 21 and a land 25 is formed around the through hole 24.

Further, in order to blind the through hole 24 formed according to the above, as shown in FIG. 13, a solder resist film 27 is formed on both surfaces of the printed wiring board 21 by coating a liquid composition mainly composed of photosensitive resin on the surfaces of the wiring board 21 through a curtain coating method or screen printing and thereafter by photocuring the composition. Instead of the above, the solder resist film 27 may be formed by hot-pressing a resist film composed of photosensitive resin onto both surfaces of the wiring board 21 and thereafter by photocuring thereof.

At that time, one of the solder resist films 27 is formed on one side ( the upper side in FIG. 13 ) of the printed wiring board 21 so that one opening 24A ( the upper opening 24A in FIG. 13 ) in the through hole 24 is blinded by the solder resist film 27. On the other side ( the lower side in FIG. 13 ) of the printed wiring board 21, the solder resist film 27 is formed so that the other opening 24A ( the lower opening 24A in FIG. 13 ) is not blinded.

However, in the conventional process that the solder resist film 27 is formed by coating the liquid composition of the photosensitive resin, a thickness of the liquid composition coated at corners 24B of the through hole 24 necessarily becomes very thin due to edge effect. Thus, it occurs a phenomenon that a thickness of the solder resist film 27 becomes very thin. In case that the solder resist film 27 becomes thin, cracks are apt to occur in the solder resist film 27 positioned at the corners 24B of the through hole 24. As a result, there is a problem that the solder resist film 27 is dropped from the inner wall of the through hole 24 and becomes trash in the through hole 24.

In the conventional process that the solder resist film 27 is formed by hot-pressing the resist film, it is difficult that the resist film flexibly follows to a difference in level occurring between the upper surfaces of the conductive layer 23 and the printed wiring board 21. Therefore, there is a fear that a gap (space) is formed between the solder resist film 27 and the land 25 after hot-pressing of the resist film. Thus, as the case may be, there is a problem that the solder resist film 27 is peeled from the printed wiring board 21 when the wiring board 21 is sucked at the time that electrical check is conducted by the checker. Similar to the above, since the gap is apt to be formed between the resist film and the circuit patterns due to the difference in level occurring between both the surfaces of the circuit patterns and the wiring board 21, it is not desirable in view of pattern protection. Further, the resist film is very expensive, thus the cost of the printed wiring board 21 cannot be reduced.

In both the above mentioned processes, one side of the through hole 24 is blinded by the solder resist film 27 and the other side ( opened side ) of the through hole 24 is sucked and fixed on the checker or the table of the checker when electrical check of the circuit patterns is conducted. Thus, in order to efficiently conduct electrical check, the lands for electrically checking the circuit patterns have to be formed on the upper side of the printed wiring board. As a result, there is a problem that the circuit patterns become complex.

SUMMARY OF THE INVENTION

Accordingly, it is an object of the present invention to overcome the above mentioned problems and to provide a printed wiring board with a through hole having therearound a conductive layer to which photosensitive insulation resin film is formed in order to blind the through hole and a process for producing such printed wiring board, thereby when electrical check of circuit patterns on the printed wiring board is done by an electrical checker while fixing the printed wiring board on the checker or a fixing table by sucking through a suction device, not only it can be easily done electrical check by inserting a top of a checker pin of the checker in the through hole without forming lands for electrical check in the circuit patterns on the printed wiring board, but also it can reliably prevent the insulation film from being dropped out from the through hole.

To accomplish the object, the present invention comprises a printed wiring board having a board, a penetration hole formed in the board and a through hole in which a conductive layer is formed on an inner wall of the penetration hole and on both an upper and a lower peripheries of the penetration hole, the printed wiring board comprising:

a film mainly composed of photosensitive resin adhered at a substantially central position of an inner wall in the through hole so that the film blinds the through hole.

According to the printed wiring board of the present invention, the conductive layer is formed on the inner wall and on both the upper and the lower peripheries of the penetration hole formed in the board, thereby the through hole is formed in the printed wiring board. Further, the film composed mainly photosensitive resin is formed at substantially central position of the inner wall in the through hole so that the film blinds the through hole.

Therefore, based on that the film is formed in the through hole, it can prevent the film from being dropped out from the through hole because an external force is never exerted to the film. Further, it can be easily and efficiently done electrical check by inserting a top of a checker pin of the checker in the through hole without forming lands for electrical check in the circuit patterns on the printed wiring board when electrical check of the circuit patterns on the printed wiring board is conducted.

Here, as concerns the board, a double-sided board and a multilayer printed wiring board may be utilizable for the present invention.

Further, the present invention provides a process for producing a printed wiring board having a board, a penetration hole formed in the board and a through hole in which a conductive layer is formed on an inner wall of the penetration hole and on both an upper and a lower peripheries of the penetration hole, the process comprising steps of:

a first step for forming the penetration hole in the board and the conductive layer on the inner wall of the penetration hole and on both the upper and the lower peripheries of the penetration hole, thereby the through hole is made;

a second step for coating liquid composition including photosensitive resin on one side of the printed wiring board and for covering the through hole by the liquid composition so that the liquid composition partially flows into the through hole; and a third step for partially photocuring the liquid composition in the through hole by irradiating light at least on the other side of the printed wiring board and for removing the liquid composition in non-cured state from the printed wiring board, thereby the film mainly composed photosensitive resin is formed in the through hole so as to blind thereof.

Here, as concerns the photosensitive resin included in the liquid composition, it is not necessary that the photosensitive resin is cured by only the light. The photosensitive resin may be cured by heating in addition to the light. That is, the photosensitive resin which has a photocuring ability that it is not removed by showering of solvent or alkali solution after the light is irradiated thereto, is utilizable for the present invention.

According to the process of the present invention, the penetration hole is formed in the board and the conductive layer is formed on the inner wall of the penetration hole and on both the upper and the lower peripheries of the penetration hole in the first step. Thereby, the through hole is made. Thereafter in the second step, the liquid composition is coated including photosensitive resin is coated on one side of the printed wiring board and the through hole is covered by the liquid composition so that the liquid composition partially flows into the through hole. Further, in the third step, after the light is irradiated at least on the other side of the printed wiring board, the liquid composition in non-cured state is removed therefrom. Thereby, the liquid composition in the through hole is partially photocured and the film mainly composed of photosensitive resin is formed in the through hole.

The above and further objects and novel features of the invention will more fully appear from the following detailed description when the same is read in connection with the accompanying drawings. It is to be expressly understood, however, that the drawings are for purpose of illustration only and not intended as a definition of the limits of the invention.

BRIEF DESCRIPTION OF THE DRAWINGS

The invention will be described with reference to the following drawings, wherein.

DETAILED DESCRIPTION OF THE PREFERRED EMBODIMENTS

A detailed description of the preferred embodiment will be given referring to the accompanying drawings. First, a construction of a printed wiring board according to the embodiment will be described hereinafter with reference to FIG. 1.

Figure 1:
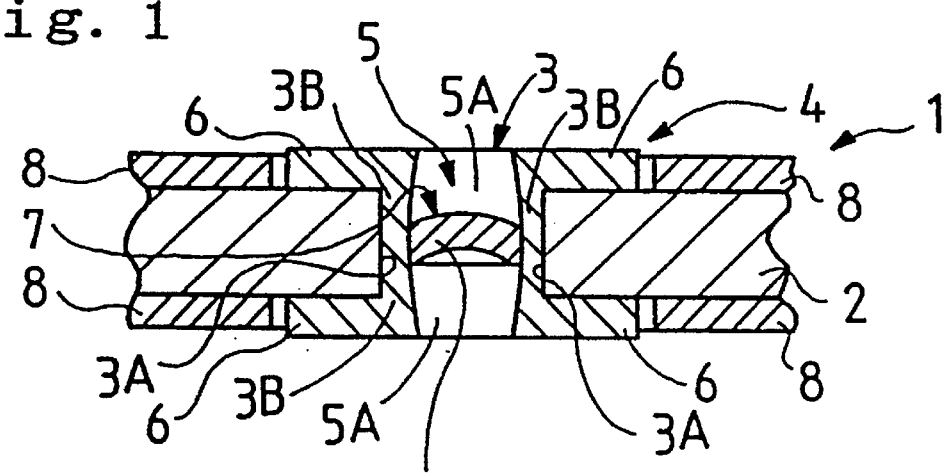
FIG. 1 is a schematic sectional view showing a printed wiring board.

In FIG. 1, the printed wiring board 1 has a double-sided board 2 on both sides of which predetermined circuit patterns are formed. In the double-sided board 2, a penetration hole 3 is formed therethrough. A conductive layer 4 is formed around an inner wall 3A of the penetration hole 3 and peripheries of both the upper and lower openings 3B, 3B by through hole plating. Thereby, a through hole 5 is formed in the printed wiring board 1 and lands 6 are formed on both the upper and lower peripheries of the through hole 5.

Here, when the conductive layer 4 is formed by through hole plating, a thickness of the conductive layer formed on the inner wall 3A is made thinner than that of the conductive layer formed as the land 6, in utilizing a characteristic that plating solution is not easy to circulate into the penetration hole 3 while through hole plating. As a result, as shown in FIG. 1, a hollow portion 7 which is wider than those of the upper and lower openings 5A, 5A, is formed at a substantially central position in the through hole 5.

On the double-sided board 2 except for the lands 6, solder resist films 8 are formed by coating liquid composition composed of 50% of photosensitive resin composition and 50% of thermosetting resin composition on both sides of the double-sided board 2. And around the hollow portion V which is formed when the conductive layer is plated in the through hole 5, a solder resist film 9 is formed with an arc shape so that it is sticked or adhered to the inner wall of the through hole 5.

The solder resist films 8 are formed not only to protect the circuit patterns on both sides of the double-sides board 2 but also to avoid adherence of melt solder to areas of the circuit patterns where solder should not be adhered. The solder resist film 9 is formed to blind the through hole 5 so that the printed wiring board 1 is sucked and fixed onto the checker or the table of the checker when electrical check of the printed wiring board 1 is conducted by the checker.

Next, an electrical check method of the circuit patterns on the printed wiring board 1, which is done by utilizing the checker pin in the checker while sucking and fixing the printed wiring board i onto the checker or the table through a suction device, and a mounting method for mounting electric components on the printed wiring board 1, will be described hereinafter with reference to FIG. 6. Here, in FIG. 6, lands 11 on which electric components such as IC chips are mounted, are formed on the upper side of the printed wiring board 1.

Figure 6:
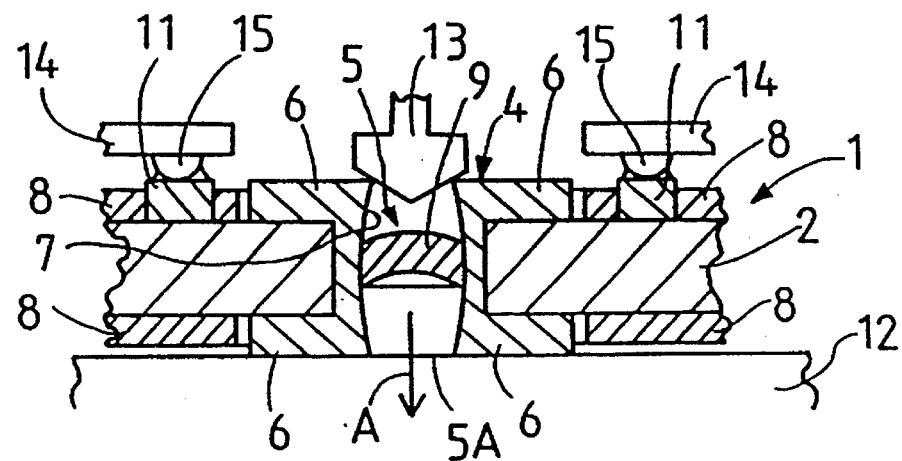
FIG. 6 is a schematic view showing an electrical check state of a circuit pattern conducted through a checker pin and a mounting state of electric components on the printed wiring board.

In FIG. 6, in case that electrical check of the circuit patterns on the printed wiring board 1 is conducted, first the printed circuit board 1 is set on a suction device 12 having a suction means such as a vacuum pump and sucked in a direction indicated by an arrow A through the suction means. At that time, the through hole 5 is blinded by the solder resist film 9 at the hollow portion 7 wider than both the upper and the lower openings 5A, 5A, thereby the printed wiring board i is sucked and fixed closely to the suction device 12.

Here, since the solder resist film 9 is formed, as mentioned above, at the hollow portion 7 wider than both the upper and the lower openings 5A, 5A and further figured in a convex shape which is projected ( arcked ) in the opposite direction to the direction of the arrow A, the solder resist film 9 is deformed so that its convex shape becomes a flat shape. Therefore, the solder resist film 9 is never dropped out from the lower opening 5A narrower than the hollow portion 7.

At the time that electrical check of the circuit patterns on the printed wiring board i is conducted, a checker pin 13 is set in the upper opening 5A of the through hole 5 as shown in FIG. 6. Here, the checker pin 13 is designed so-that the top portion thereof is not contacted with the solder resist film 9. Accordingly, electrical check of the patterns can be efficiently conducted in the printed wiring board 1 by directly setting the checker pin 13 in the upper opening 5A of the through hole 5.

At the time that the electric components such as the IC chips 14 are mounted on the lands 11, solder paste is coated on each of the lands 11 while sucking and fixing the printed wiring board 1 by the suction device 12. Thereafter, the lands 11 and solder bumps 15 formed under the IC chips 14 are precisely positioned with each other, and further reflow treatment is conducted. Based on the above process, the IC chips 14 are mounted on the lands 11. Here, each of the lands 11 on which the IC chip 14 is mounted is arranged on the side of the board 1 as same as the projected side of the solder resist film 9. In other words, the lands 11 are arranged on the side of the board 1 opposite to the side which is directed in the suction direction ( the direction indicated by the arrow A ) by the suction device 12. Therefore, there is no problem in mounting the IC chips 14 on the lands 11 while sucking the printed wiring board 1 by the suction device 12.

In addition to both the case that electrical check is done by the checker pin is and the case that the solder paste is coated on the lands 11 when the IC chips 14 are mounted on the printed wiring board 1, the above mentioned suction of the printed wiring board 1 by the suction device 12 is conducted when characters or the like are printed on the wiring board 1.

As mentioned above, in the printed wiring board 1 of the embodiment, the through hole 5 is blinded at the hollow portion 7 therein wider than both the upper and the lower openings 5A, 5A by the solder resist film 9 sticked to the inner wall of the though hole 5. Thereby, it can avoid that an external force is directly exerted to the solder resist film 9, thus it can certainly prevent the solder resist film 9 from being dropped out from the through hole 5. As a result, the solder resist film 9 never becomes a cause of dust.

Figure 13:
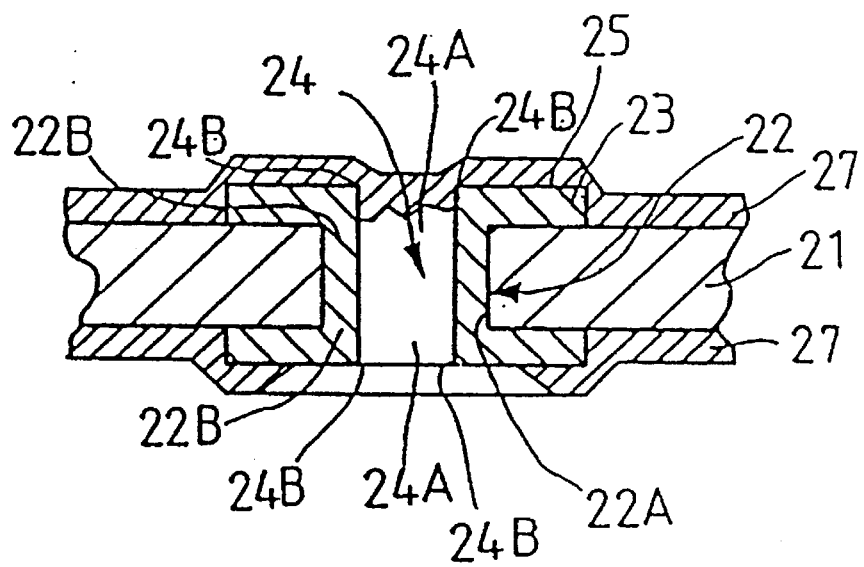
FIG. 13 is a schematic sectional view of the conventional double-sided printed wiring board showing a state after the through hole is blinded

Further, different from the above conventional blind construction in FIG. 13, since the through hole 5 is blinded by the solder resist film 9 which is formed at a substantially central position in the through hole 5, electrical check of the patterns on the printed wiring board i can be efficiently conducted by setting the checker pin 13 in the through hole 5 when such electrical check is conducted by the checker. Therefore, it is not necessary to especially form the lands in the circuit patterns for electrically checking the patterns, thus construction of the printed wiring board 1 can be easily simplified.

Next, processes for producing the above constructed wiring board 1 will be described hereinafter with reference to FIGS. 2–5. First process will be described according to FIG. 2.

Figure 2:
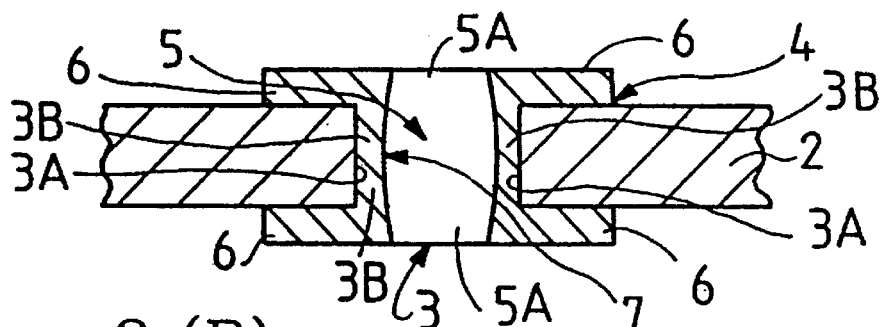
FIGS. 2(A)–2(D) are views schematically showing a first process for producing the printed wiring board according to the embodiment.
Figure 2:
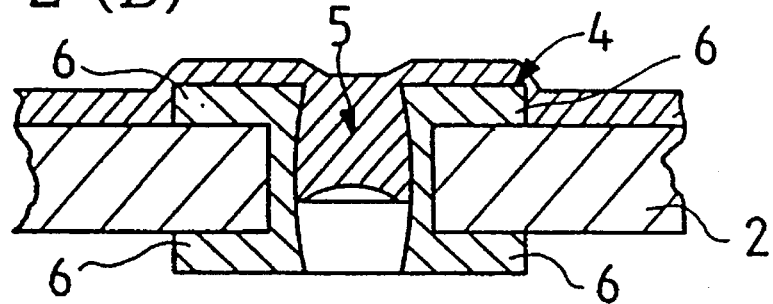
Figure 2:
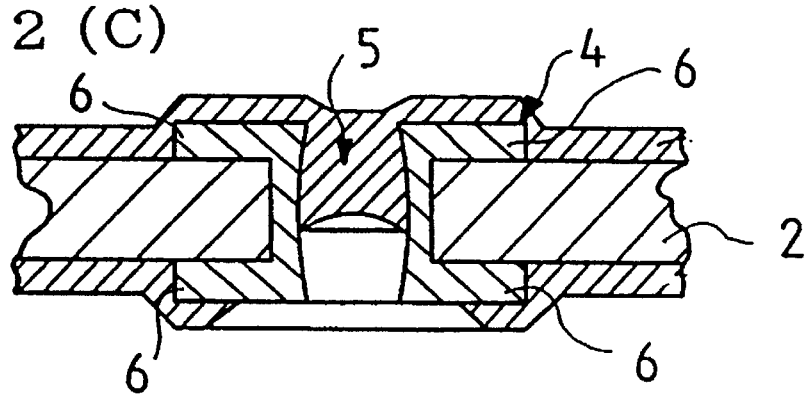
Figure 2:
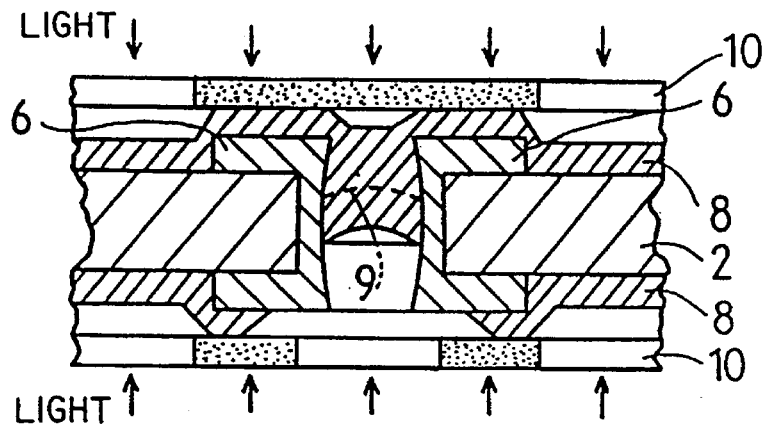

In FIG. 2, in order to produce the printed wiring board 1, the penetration hole 3 is formed in the double-sided board 2 on both sides of which copper foils are pressed into one body, thereafter the conductive layer 4 is plated to both the inner wall 3A of the penetration hole 3 and the peripheries of the upper and the lower openings 3B, 3B. Thereby, the through hole 5 is formed. Further, the copper foils and conductive layer 4 are etched by a well-known subtracitve process, thereby predetermined circuit patterns are formed on both sides of the double-sided board 2. At that time, as mentioned above, the hollow portion 7 wider than the upper and the lower openings 5A, 5A is formed in the through hole 5 and the lands 6 are formed on the periphery of the through hole 5. This state is shown in FIG. 2(A).

As shown in FIG. 2(B), the liquid composition composed of photosensitive resin and thermosetting resin is coated on the upper side of the double-sided board 2 by screen printing so that the liquid composition covers the lands 6 and partially flows into the through hole 5 to about the center position thereof, thereafter the liquid composition is dried. Similarly, as shown in FIG. 2(C), the liquid composition is coated on the lower side of the double-sided board 2 except for the through hole 5 so that the liquid composition partially covers each land 6, thereafter the liquid composition is dried. At that time, the lower surface of the liquid composition flowing into the through hole 5 becomes an arc shape projected upward due to surface tension, viscosity, the other physical property of the liquid composition.

Further, as shown in FIG. 2(D), the lands 6 on the upper side of the double-sided board 2 are covered by a negative film 10 and similarly a part of each land 6, on which the liquid composition is coated, on the lower side of the double-sided board 2 is covered by a negative film 10. Thereafter, ultraviolet rays (light) is irradiated on both sides of the double-sided board 2 by an exposing device. Thereby, the liquid composition existing on areas of the board 2 which are not covered by black portions of the negative film 10 is photocured. On the contrary, the liquid composition existing on areas of the board 2 which are covered by black portions of the negative film 10 retains a non-cured state without being photocured. Further, the double-sided board 2 after irradiated by ultraviolet rays is treated by a solution including $Na_2CO_3$ of 1%. Thereby, the non-cured liquid composition is dissolved and removed from the board 2 and the solder resist film 8 with a predetermined figure is formed on both sides of the double-sided board 2. As a result, the liquid composition existing outer from the lands 6 on the upper side of the board 2 is photocured and becomes the solder resist film 8. Similarly to this, the liquid composition existing outer from the lands 6 on the lower side of the board 2 is photocured and becomes the solder resist film 8. Further, the liquid composition flowing into the through hole 5 is photocured at the lower side thereof by ultraviolet rays irradiating the lower side of the board 2, thereby the solder resist film 9 with a predetermined thickness ( such thickness is controlled, for example, by flexibly setting irradiating time of ultraviolet rays) is formed at the hollow portion 7 of the through hole 5.

After the solder resist films 8, 9 are formed by selectively photocuring the liquid composition according to the above, the solder resist films 8, 9 are thermoset for 2 hours at 150° C. Thereafter, the printed wiring board 1 shown in FIG. 1 is obtained.

The second process will be described with reference to FIG. 3. Here, in the second process shown in FIG. 3, the printed wiring board 1 is produced according to the procedures basically same as those in the first process and the second process is different from the first process at only a point that the solder resist film 9 is formed in the through hole 5 by irradiating ultraviolet rays on both sides of the double-sided board 2.

Figure 3:
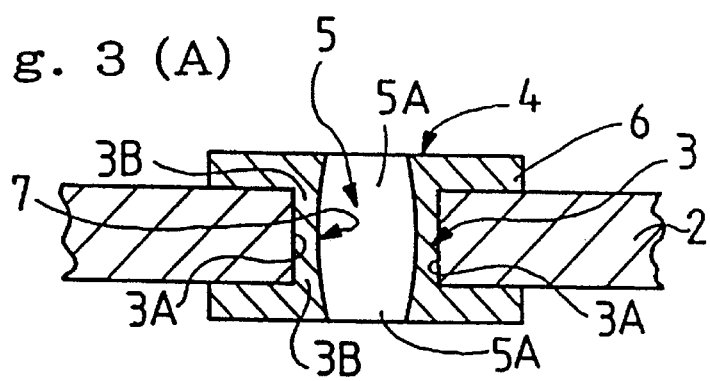
FIGS. 3(A)–3(E) are views schematically showing a second process for producing the printed wiring board according to the embodiment.
Figure 3:
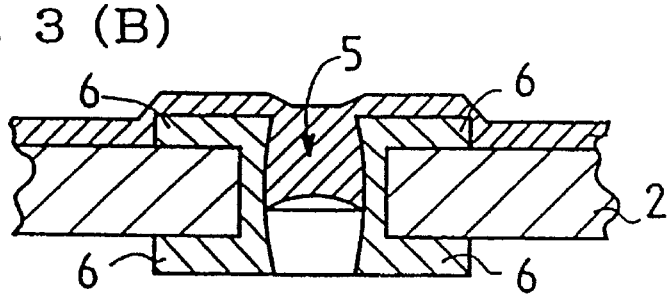
Figure 3:
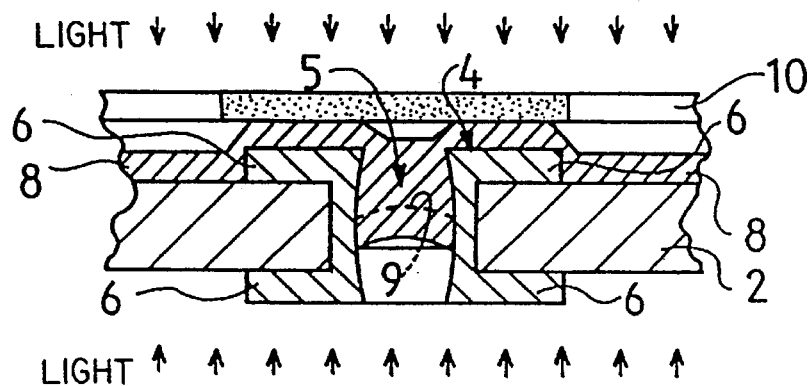
Figure 3:
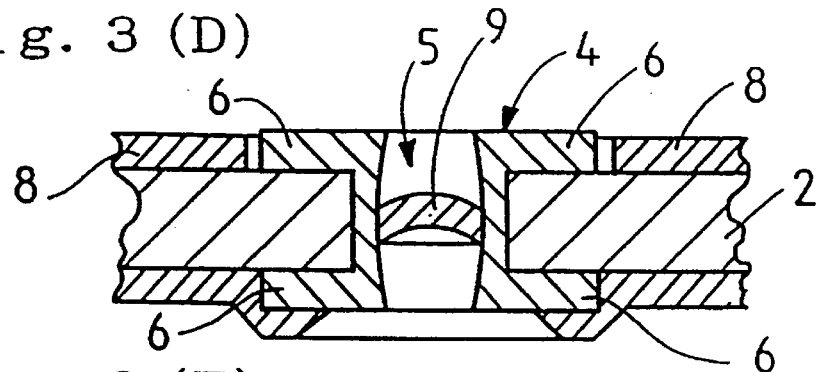
Figure 3:
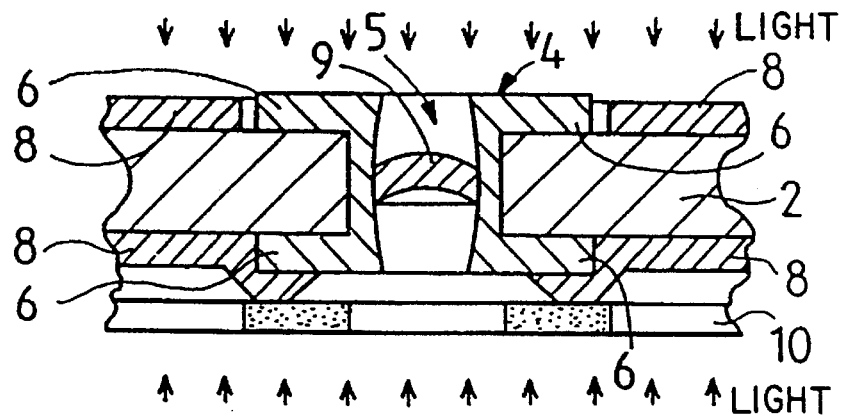

In FIG. 3, similar to the procedure shown in FIG. 2(A) in the first process, the penetration hole 3 is formed in the double-sided board 2 on both sides of which copper foils are pressed into one body, thereafter the conductive layer 4 is plated to both the inner wall 3A of the penetration hole 3 and the peripheries of the upper and the lower openings 3B, 3B. Thereby, the through hole 5 is formed. Further, the copper foils and conductive layer 4 are etched by a well-known subtracitve process, thereby predetermined circuit patterns are formed on both sides of the double-sided board 2. At that time, as mentioned above, the hollow portion 7 wider than the upper and the lower openings 5A, 5A is formed in the through hole 5 and the lands 6 are formed on the periphery of the through hole 5. This state is shown in FIG. 3(A).

As shown in FIG. 3(B), similar to the procedure shown in FIG. 2(B) in the first process, the liquid composition composed of photosensitive resin and thermosetting resin is coated on the upper side of the double-sided board 2 by curtain coating method so that the liquid composition covers the lands 6 and partially flows into the through hole 5 to about the center position thereof, thereafter the liquid composition is dried. At that time, the lower surface of the liquid composition flowing into the through hole 5 becomes an arc shape projected upward due to surface tension, viscosity, the other physical property of the liquid composition.

Further, as shown in FIG. 3(C), after the lands 6 on the upper side of the double-sided board 2 are covered by a negative film 10 with a black portion, ultraviolet rays is irradiated on the both sides of the double-sided board 2 by the exposing device.

Thereby, the liquid composition existing on areas of the board 2 which are not covered by the black portion of the negative film 10 is photocured. On the contrary, the liquid composition existing on an area of the board 2 which is covered by the black portion of the negative film 19 retains a non-cured state without being photocured. As a result, the liquid composition existing outer from the lands 6 on the upper side of the board 2 is photocured and becomes the solder resist film 8. Further, the liquid composition flowing into the through hole 5 is photocured at the lower side thereof by ultraviolet rays irradiating the lower side of the board 2, thereby the solder resist film 9 with a predetermined thickness ( such thickness is controlled, for example, by flexibly setting irradiating time of ultraviolet rays) is formed at the hollow portion 7 of the through hole 5.

After the solder resist films 8, 9 are formed by selectively photocuring the liquid composition according to the above, the non-cured liquid composition covered by the black portions of the negative films 10 is dissolved and removed according to the same way in the first process.

Next, the liquid composition is coated on the lower side of the double-sided board 2 except for the through hole 5 so that the liquid composition partially covers each land 6, thereafter the liquid composition is dried. This state is shown in FIG. 3(D). And a part of each land 6, on which the liquid composition is coated, on the lower side of the double-sided board 2 is covered by the black portions of the negative film 10. Thereafter, ultraviolet rays is irradiated on both sides of the double-sided board 2 by the exposing device. Thereby, the liquid composition existing on areas of the board 2 which are not covered by the black portions of the negative film 10 is photocured and becomes the solder resist film 8. On the contrary, the liquid composition existing on areas of the board 2 which are covered by the black portion of the negative film 10 retains a non-cured state without being photocured. At this time, ultraviolet rays is irradiated on both the upper and the lower sides of the solder resist film 9 through the through hole 5, thereby the solder resist film 9 is completely photocured and firmly adhered to the inner wall of the through hole 5.

Thereafter, by removing the liquid composition in a non-cured state covered by the black portions of the negative film 10, the printed wiring board i shown in FIG. 1 is obtained. The solder resist films 8, 9 are improved in both heat resistance and chemical resistance by being thermoset.

Next, the third process will be described with reference to FIG. 4. Here, in the second process shown in FIG. 4, the printed wiring board 1 is produced according to the procedures basically same as those in the first process and the second process.

Figure 4:
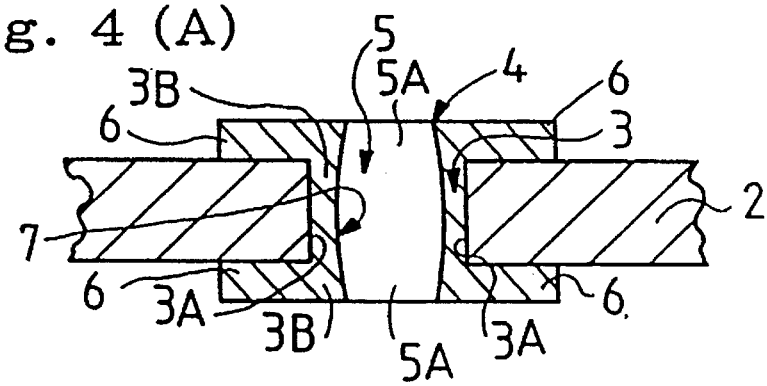
FIGS. 4(A)–4(E) are views schematically showing a third process for producing the printed wiring board according to the embodiment.
Figure 4:
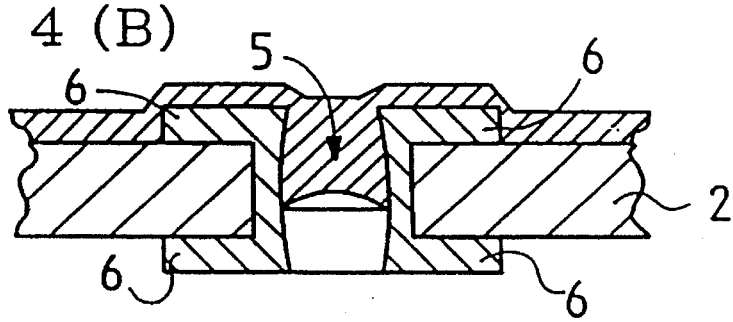
Figure 4:
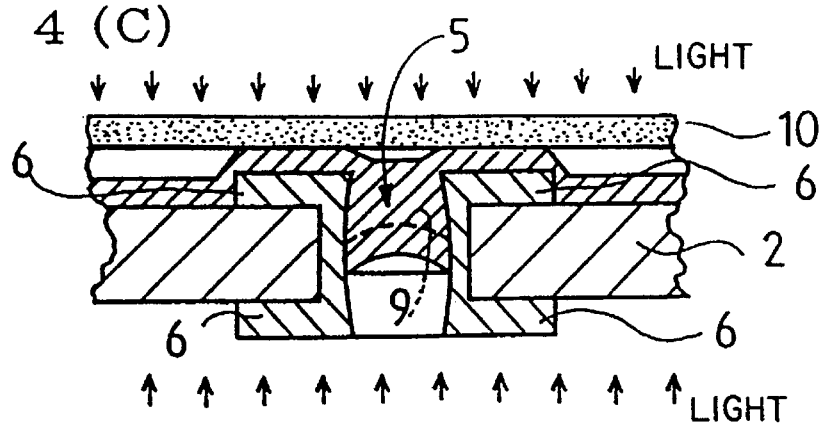
Figure 4:
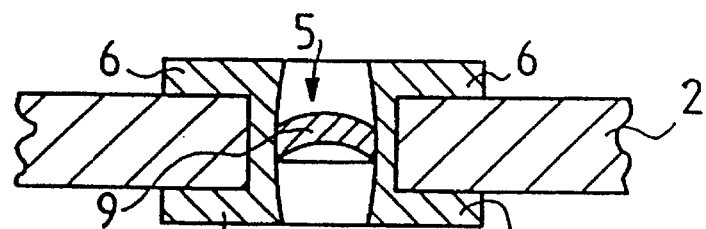
Figure 4:
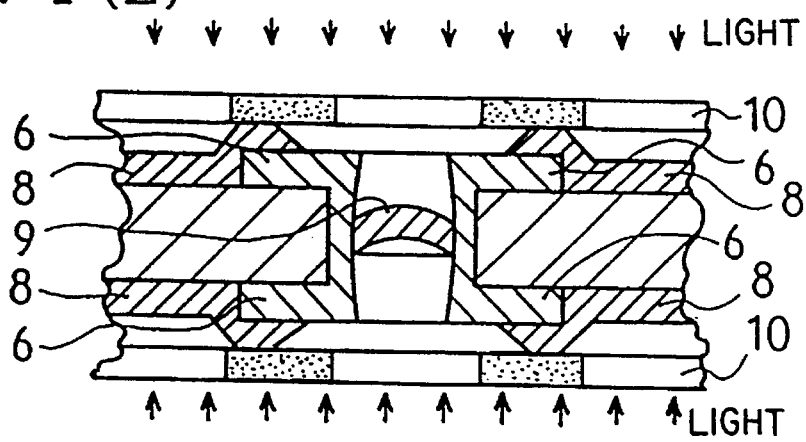

In FIG. 4, similar to the procedures shown in FIG. 2(A) in the first process and shown in FIG. 3(A) in the second process, the penetration hole 3 is formed in the double-sided board 2 on both sides of which copper foils are pressed into one body, thereafter the conductive layer 4 is plated to both the inner wall 3A of the penetration hole 3 and the peripheries of the upper and the lower openings 3B, 3B. Thereby, the through hole 5 is formed. Further, the copper foils and conductive layer 4 are etched by a well-known subtracitve process, thereby predetermined circuit patterns are formed on both sides of the double-sided board 2. At that time, as mentioned above, the hollow portion 7 wider than the upper and the lower openings 5A, 5A is formed in the through hole 5 and the lands 6 are formed on the periphery of the through hole 5. This state is shown in FIG. 4(A).

Thereafter, similar to the procedures shown in FIG. 2(B) and in FIG. 3(B), the liquid composition composed of photosensitive resin and thermosetting resin is coated on the upper side of the double-sided board 2 by screen printing so that the liquid composition covers the lands 6 and partially flows into the through hole 5 to about the center position thereof, thereafter the liquid composition is dried. At that time, the lower surface of the liquid composition flowing into the through hole 5 becomes an arc shape projected upward due to surface tension, viscosity, the other physical property of the liquid composition.

Further, as shown in FIG. 4(C), after the upper side of the double-sided board 2 is entirely covered by the negative film 10 having the black portion thereover, ultraviolet rays is irradiated on both sides of the board 2 by the exposing device. Thereby, the lower side of the liquid composition in the through hole 5 is photocured by ultraviolet rays irradiating the lower side of the board 2, and the solder resist film 9 is formed with a predetermined thickness ( such thickness is controlled, for example, by flexibly setting irradiating time of ultraviolet rays) is formed at the hollow portion 7 of the through hole 5. On the contrary, the liquid composition existing over the upper side of the board 2 entirely covered by the black negative film 10 is not photocured and retains a non-cured state.

Thereafter, by removing the liquid composition in a non-cured state on the upper side of the board 2, the solder resist film 9 is formed at a substantially central position in the through hole 5, as shown in FIG. 4(D).

Next, as shown in FIG. 4(E), the liquid composition is coated on both sides of the double-sided board 2 except for the through hole 5 so that the liquid composition partially covers a part of each land 6, thereafter the negative films 10 are arranged on both sides of the board 2 so that each of the lands 6 is covered by the black portion. Further, ultraviolet rays is irradiated on both sides of the board 2 by the exposing device. Thereby, the liquid composition existing on areas of the upper side of the board 2 which are not covered by the black portions of the negative film 10 except for the lands 6, is photocured and becomes the solder resist films 8. On the contrarily, the liquid composition existing on the lands 6 which are covered by the black portions of the negative film 10 retains non-cured state without being photocured.

Similarly to the above, on the lower side of the double-sided board 2, the liquid composition existing on areas which are not covered by the black portions of the negative film 10 except for the lands 6 is photocured and becomes the solder resist film 8. Contrarily, the liquid composition existing on the lands 6 which are covered by the black portions of the negative film 10 retain non-cured states without being photocured. In the above process, ultraviolet rays is irradiated to both the upper and the lower sides of the solder resist film 9 through the through hole 5, thus the solder resist film 9 is completely photocured and adhered to the inner wall of the through hole 5.

Thereafter, the liquid composition retaining a non-cured state on the lands 6 by being covered through the black portions of the negative films 10 is removed, thereby the printed wiring board 1 shown in FIG. 1 is obtained. Here, the solder resist films 8, 9 formed according to the above are thermoset.

Next, the fourth process will be described with reference to FIG. 5. Here, in the fourth process shown in FIG. 5, the printed wiring board 1 is produced according to the procedures basically same as those in the third process and the fourth process is different from the third process at a point that ultraviolet rays is irradiated on one side of the double-sided board 2 by the exposing device when the solder resist film 9 is formed in the through hole 5.

Figure 5:
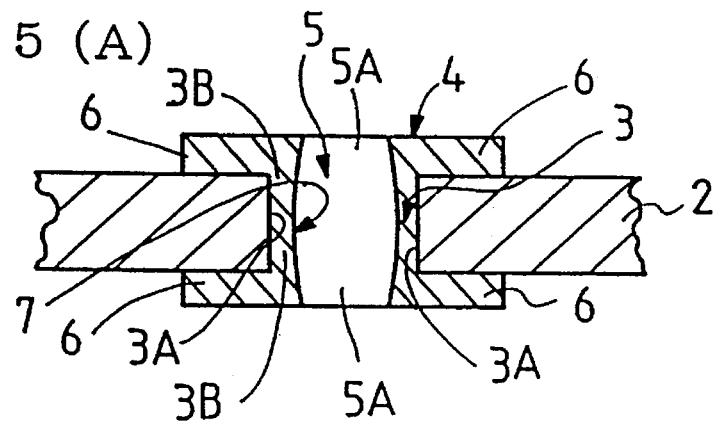
FIGS. 5(A)–5(E) are views schematically showing a fourth process for producing the printed wiring board according to the embodiment.
Figure 5:
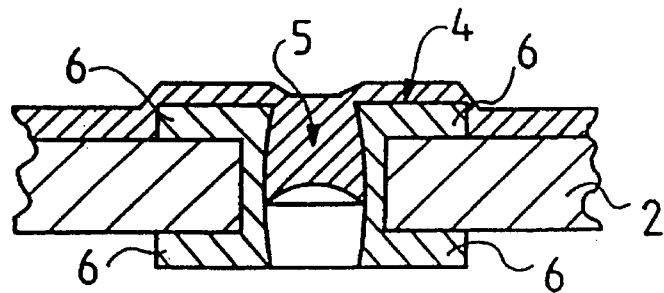
Figure 5:
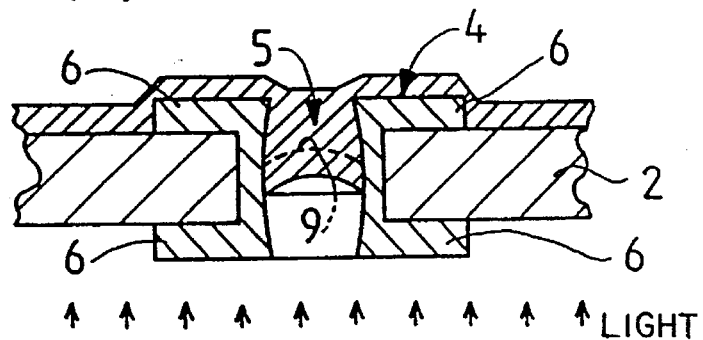
Figure 5:
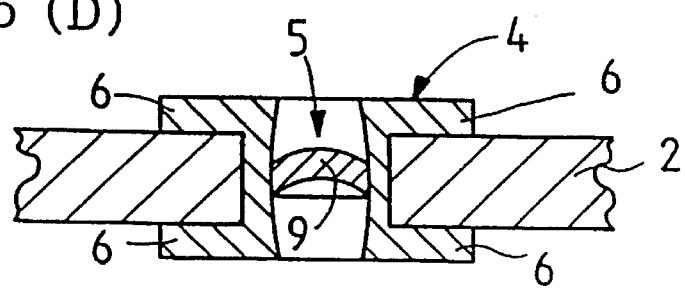
Figure 5:
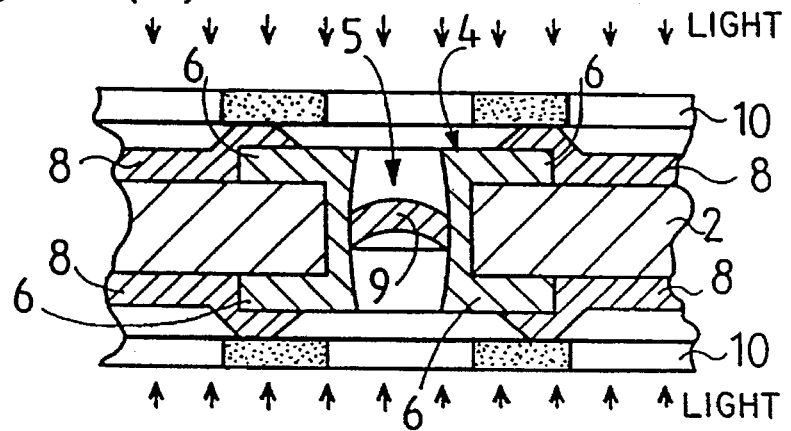

In FIG. 5, similar to the procedures shown in FIG. 2(A) in the first process, in FIG. 3(A) in the second process and in FIG. 4(A) in the third process, the penetration hole 3 is formed in the double-sided board 2 on both sides of which copper foils are pressed into one body, thereafter the conductive layer 4 is plated to both the inner wall 3A of the penetration hole 3 and the peripheries of the upper and the lower openings 3B, 3B. Thereby, the through hole 5 is formed. At that time, as mentioned above, the hollow portion 7 wider than the upper and the lower openings 5A, 5A is formed in the through hole 5 and the lands 6 are formed on the periphery of the through hole 5. This state is shown in FIG. 5(A).

Thereafter, similar to the procedures shown in FIG. 2(B), in FIG. 3(B) and in FIG. 4(B), the liquid composition composed of photosensitive resin and thermosetting resin is coated on the upper side of the double-sided board 2 by screen printing so that the liquid composition covers the lands 6 and partially flows into the through hole 5 to about the center position thereof, thereafter the liquid composition is dried. At that time, the lower surface of the liquid composition flowing into the through hole 5 becomes an arc shape projected upward due to surface tension, viscosity, the other physical property of the liquid composition.

Further, as shown in FIG. 5(C), ultraviolet rays is irradiated on the lower side of the double-sided board 2 by the exposing device. Thereby, the lower side of the liquid composition in the through hole 5 is photocured by the rays irradiated through the through hole 5, as a result, the solder resist film 9 with a predetermined thickness ( such thickness is controlled, for example, by flexibly setting irradiating time of ultraviolet rays ) is formed at the hollow portion 7 of the through hole 5. At this time, the non-cured liquid composition exists on the upper side of the solder resist film 9 as shown in FIG. 5(C). Thereafter, the liquid composition retaining a non-cured state on the upper side of the double-sided board 2 is removed, thus the solder resist film 9 is formed at substantially central position in the through hole 5 as shown in FIG. 5(D).

Next, as shown in FIG. 5(E), the liquid composition is coated on both sides of the double-sided board 2 except for the through hole 5 so that the liquid composition partially covers each land 6, thereafter the negative films 10 are arranged on both sides of the board 2 so that each of the lands 6 is covered by the black portions of the negative films 10. Further, ultraviolet rays is irradiated on both sides of the board 2 by the exposing device. Thereby, the liquid composition existing on areas of the upper side of the board 2 which are not covered by the black portions of the negative film 10 except for the lands 6, is photocured and becomes the solder resist film 8. On the contrarily, the liquid composition existing on the lands 6 which are covered by the black portions of the negative film 10 retains a non-cured state without being photocured.

Similarly to the above, on the lower side of the double-sided board 2, the liquid composition existing on areas which are not covered by the black portions of the negative film 10 except for the lands 6 is photocured and becomes the solder resist film 8. Contrarily, the liquid composition existing on the lands 6 which are covered by the black portions of the negative film 10 retains a non-cured state without being photocured. In the above process, ultraviolet rays is irradiated to both the upper and the lower sides of the solder resist film 9 through the through hole 5, thus the solder resist film 9 is completely photocured and adhered to the inner wall of the through hole 5.

Thereafter, the liquid composition retaining a non-cured state on the lands 6 by being covered through the black portions of the negative films 10 is removed, thereby the printed wiring board 1 shown in FIG. 1 is obtained. Here, the solder resist films 8, 9 formed according to the above are thermoset if necessary.

As mentioned above, according to the first process through the fourth process, the solder resist film 9 can be formed at the hollow portion 7 so as to be firmly adhered to the inner wall thereof in the through hole 5 in which the conductive layer 4 is plated on both the inner wall 3A of the penetration hole 3 in the double-sided board 2 and the peripheries of the upper and the lower openings 3B, 3B. Thereby, the through hole 5 is blinded by the solder resist film 9 without being dropped out from the through hole 5 and electrical check of the circuit patterns on the printed wiring board 1 can be easily and efficiently conducted while setting the checker pin 13 of the checker in the through hole 5.

Next, various modifications of the printed wiring board 1 will be described with reference to FIGS. 7–11. Here, in the following description, the same elements in the printed wiring board 1 of the above embodiment are numbered by the same numbers. And the printed wiring boards i corresponding to the first modification through the fifth modification are produced by the first through the fourth process, thus a detailed description of the process for producing the modifications will be omitted.

Figure 7:
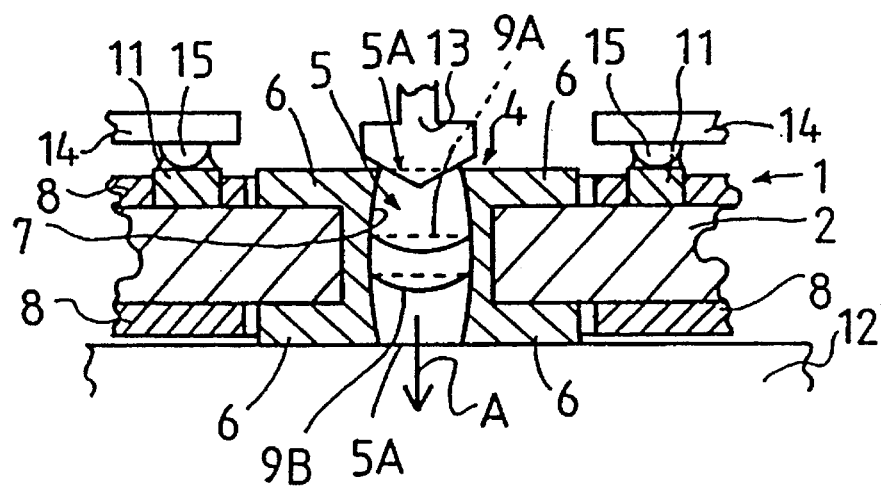
FIG. 7 is a schematic view showing an electrical check state of a circuit pattern conducted through a checker pin and a mounting state of electric components on the printed wiring board, in a first modification of the printed wiring board.

First, the printed wiring board 1 according to the first modification will be described with reference to FIG. 7. In FIG. 7, the printed wiring board 1 of the first modification is different from the printed wiring board 1 shown in FIGS. 1 and 6 at a point that the solder resist film 9 formed at the hollow portion 7 in the through hole 5 has a flat shape or an arc shape projected to downward-direction. The other construction of the first modification is as same as that of the wiring board shown in FIGS. 1 and 6. Therefore, the different point will be mainly described in the following.

In FIG. 7, a solder resist film 9A with a flat shape ( shown in FIG. 7 as a dotted line ) is formed at the hollow portion 7 in the through hole 5. Such solder resist film may be formed as a solder resist film 9B with an arc shape projected to downward direction ( shown in FIG. 7 as a solid line ). Here, it can select whether the solder resist film is formed as the film 9A with the flat shape or as the film 9B with the arc shape, by selectively changing surface tension, viscosity of the liquid composition which is composed of photosensitive resin and thermosetting resin to form the solder resist film. Such surface tension and viscosity of the liquid composition is changed by suitably changing content fraction of diluent, resin solid material or inorganic filler in the liquid composition.

When electrical check of the circuit patterns on the printed wiring board 1 of the first modification is conducted, the wiring board 1 is set on the suction device 12 with the suction means such as a vacuum pump, similarly in FIG. 6. Thereafter, the wiring board 1 is sucked in the direction indicated by the arrow A. At that time, the through hole 5 is blinded at the hollow portion 7 wider than both the upper and the lower openings 5A, 5A by the solder resist film 9A or 9B, therefore the printed wiring board 1 is sucked and closely fixed on the suction device 12.

Here, since the solder resist film 9A or 9B is formed at the hollow portion 7 wider than the openings 5A, 5A, the solder resist film 9A or 9B never dropped out from the lower opening 5A which is narrower than the hollow portion 7 while sucking by the suction device 12.

In case that electrical check of the circuit patterns on the printed wiring board i is conducted by the checker, the checker pin 13 is set in the upper opening 5A of the though hole 5 as shown in FIG. 7. At that time, the shape of the checker pin 13 is formed so that the top of the checker pin 13 is not contacted with the solder resist film 9A or 9B. Thus, in the printed wiring board 1 of the first modification, electrical check of the circuit patterns thereon can be efficiently conducted by setting the checker pin 13 in the upper opening 5A of the through hole 5.

At the time that the electric components such as the IC chips 14, chip resistors, condensers are mounted on the lands 11, solder paste is coated on each of the lands 11 while sucking and fixing the printed wiring board 1 by the suction device 12. Thereafter, the lands 11 and the resist bumps 15 formed under the IC chips 14 are precisely positioned with each other, and further reflow treatment is conducted. Based on the above process, the IC chips 14 are mounted on the lands 11. Here, each of the lands 11 on which the IC chip 14 is mounted is arranged on the side of the board 1 as same as the projected side of the solder resist film 9. In other words, the lands 11 are arranged on the side of the board 1 opposite to the side which is directed in the suction direction ( the direction indicated by the arrow A ) by the suction device 12. Therefore, there is no problem in mounting the IC chips 14 on the lands 11 while sucking the printed wiring board 1 by the suction device 12.

Next, the printed wiring board i according to the second modification will be described with reference to FIG. 8. In the printed wiring board 1 of the second modification, the shape of the through hole 5 is different from that of the wiring board 1 in FIGS. 1 and 6 at a point that the shape of the through hole 5 is formed as a tapered hole without the hollow portion 7 by forming the upper opening 5A so as to become wider than the lower opening 5A. The other construction of the second modification is as same as that of the wiring board shown in FIGS. 1 and 6. Therefore, the different point will be mainly described in the following.

Figure 8:
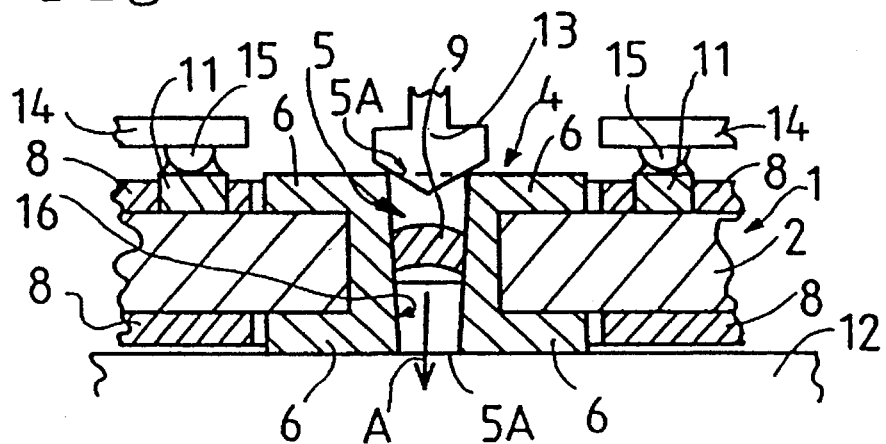
FIG. 8 is a schematic view showing an electrical check state of a circuit pattern conducted through a checker pin and a mounting state of electric components on the printed wiring board, in a second modification of the printed wiring board.

In the through hole 5 of the printed wiring board 1 shown in FIG. 8, the upper opening 5A is formed so as to become wider than the lower opening 5A, thus a tapered-hole 16 which is gradually tapered from the upper opening 5A toward the lower opening 5A. The tapered hole 16 is formed by irradiating a laser beam from a laser device on the upper side of the double-sided board 2, and the opening area of the tapered hole 16 gradually becomes narrower going from the upper side of the wiring board 1 toward the lower side thereof. At a substantially central position of the tapered hole 16, the solder resist film 9 with an arc shape projected to the upward direction is formed, similarly to the printed wiring board i in FIGS. 1 and 6.

When electrical check of the circuit patterns on the printed wiring board 1 of the second modification is conducted, the wiring board 1 is set on the suction device 12 with the suction means such as a vacuum pump, similarly in FIG. 6. Thereafter, the wiring board 1 is sucked in the direction indicated by the arrow A. At that time, the through hole 5 is blinded at the tapered hole by the solder resist film 9, therefore the printed wiring board 1 is sucked and closely fixed on the suction device 12.

Here, since the solder resist film 9 is formed at the central position of the tapered hole 16 and has the arc shape projected to the direction opposite to the arrowed direction indicated by the arrow A, the solder resist film 9 is deformed to the direction that the solder resist film 9 becomes flat. Therefore, the solder resist film 9 is never dropped out from the lower opening 5A which is narrower than the upper opening 5A while sucking by the suction device 12.

In case that electrical check of the circuit patterns on the printed wiring board 1 is conducted by the checker, the checker pin 13 is set in the upper opening 5A of the though hole 5 as shown in FIG. 8. At that time, the shape of the checker pin 13 is formed so that the top of the checker pin 13 is not contacted with the solder resist film 9. Thus, in the printed wiring board 1 of the second modification, electrical check of the circuit patterns thereon can be efficiently conducted by directly setting the checker pin 13 in the upper opening 5A of the through hole 5.

At the time that the electric components such as the IC chips 14 are mounted on the lands 11, solder paste is coated on each of the lands 11 while sucking and fixing the printed wiring board 1 by the suction device 12. Thereafter, the lands 11 and the resist bumps 15 formed under the IC chips 14 are precisely positioned with each other, and further reflow treatment is conducted. Based on the above process, the IC chips 14 are mounted on the lands 11. Here, each of the lands 11 on which the IC chip 14 is mounted is arranged on the side of the board 1 as same as the projected side of the solder resist film 9. In other words, the lands 11 are arranged on the side of the board 1 opposite to the side which is directed in the suction direction ( the direction indicated by the arrow A ) by the suction device 12. Therefore, there is no problem in mounting the IC chips 14 on the lands 11 while sucking the printed wiring board 1 by the suction device 12.

Next, the printed wiring board 1 according to the third modification will be described with reference to FIG. 9. In the printed wiring board 1 of the third modification, there are differences between the third modification and the embodiment in FIGS. 1 and 6 at the following points. That is, the first point is that the shape of the through hole 5 is formed as a tapered hole without the hollow portion 7 by forming the upper opening 5A so as to become wider than the lower opening 5A.

The second point is that the solder resist film 9 has a flat shape or an arc shape projected to downward direction. The other construction of the third modification is as same as that of the wiring board shown in FIGS. 1 and 6. Therefore, the different points will be mainly described in the following.

Figure 9:
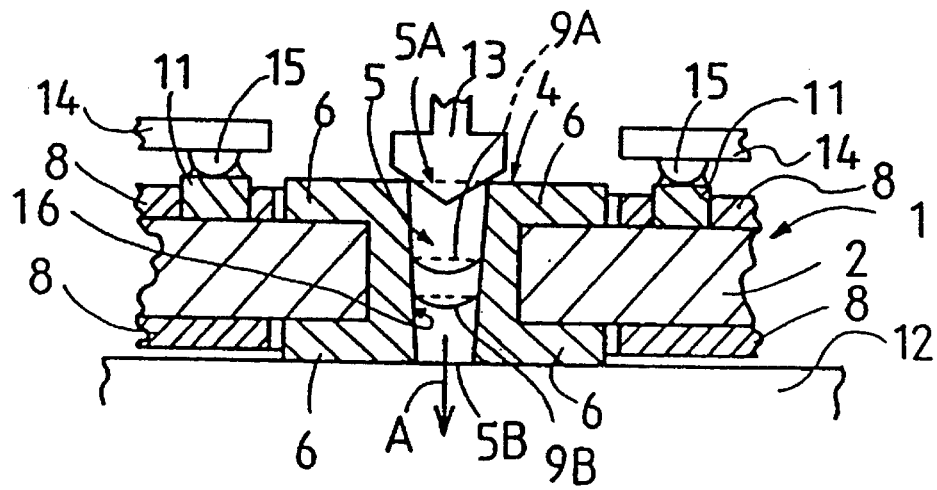
FIG. 9 is a schematic view showing an electrical check state of a circuit pattern conducted through a checker pin and a mounting state of electric components on the printed wiring board, in a third modification of the printed wiring board.

In the through hole 5 of the printed wiring board 1 shown in FIG. 9, the upper opening 5A is formed so as to become wider than the lower opening 5A, thus a tapered hole 16 which is gradually tapered from the upper opening 5A toward the lower opening 5A. The tapered hole 16 is formed by irradiating a laser beam from a laser device on the upper side of the double-sided board 2, and the opening area of the tapered hole 16 gradually becomes narrower going from the upper side of the wiring board 1 toward the lower side thereof. At a substantially central position of the tapered hole 16, the solder resist film 9A with the flat shape ( shown in FIG. 9 as a dotted line ) is formed, similarly in FIG. 7. Such solder resist film may be formed as a solder resist film 9B with an arc shape projected to downward direction ( shown in FIG. 9 as a solid line ). Here, it can select whether the solder resist film is formed as the film 9A with the flat shape or as the film 9B with the arc shape, by selectively changing surface tension, viscosity of the liquid composition which is composed of photosensitive resin and thermosetting resin to form the solder resist film. Such surface tension and viscosity of the liquid composition is changed by suitably changing content fraction of diluent, resin solid material or inorganic filler in the liquid composition.

When electrical check of the circuit patterns on the printed wiring board 1 of the third modification is conducted, the wiring board 1 is set on the suction device 12 with the suction means such as a vacuum pump, similarly in FIG. 6. Thereafter, the wiring board 1 is sucked in the direction indicated by the arrow A. At that time, the through hole 5 is blinded at the tapered hole 16 by the solder resist film 9A or 9B, therefore the wiring board 1 is sucked and closely fixed on the suction device 12.

Here, since the solder resist film 9A or 9B is formed at the central position of the tapered hole 16, the solder resist film 9A or 9B is never dropped from the lower opening 5A which is narrower than the upper opening 5A while sucking by the suction device 12.

In case that electrical check of the circuit patterns on the printed wiring board 1 is conducted by the checker, the checker pin 13 is set in the upper opening 5A of the though hole 5 as shown in FIG. 9. At that time, the shape of the checker pin 13 is formed so that the top of the checker pin 13 is not contacted with the solder resist film 9A or 9B. Thus, in the printed wiring board 1 of the third modification, electrical check of the circuit patterns thereon can be efficiently conducted by directly setting the checker pin 13 in the upper opening 5A of the through hole 5.

At the time that the electric components such as the IC chips 14 are mounted on the lands 11, solder paste is coated on each of the lands 11 while sucking and fixing the printed wiring board 1 by the suction device 12. Thereafter, the lands 11 and the resist bumps 15 formed under the IC chips 14 are precisely positioned with each other, and further reflow treatment is conducted. Based on the above process, the IC chips 14 are mounted on the lands 11. Here, each of the lands 11 on which the IC chip 14 is mounted is arranged on the side of the board 1 opposite to the suction direction through the suction device 12 indicated by the arrow A. Therefore, there is no problem in mounting the IC chips 14 on the lands 11 while sucking the printed wiring board 1 by the suction device 12.

Next, the printed-wiring board 1 according to the fourth modification will be described with reference to FIG. 10. In the printed wiring board 1 of the fourth modification, the shape of the through hole 5 is different from that of the wiring board 1 in FIGS. 1 and 6 at a point that the shape of the through hole 5 is formed as a straight hole without the hollow portion 7 by forming the upper opening 5A so as to become the same size as the lower opening 5A. The other construction of the fourth modification is as same as that of the wiring board shown in FIGS. 1 and 6. Therefore, the different point will be mainly described in the following.

Figure 10:
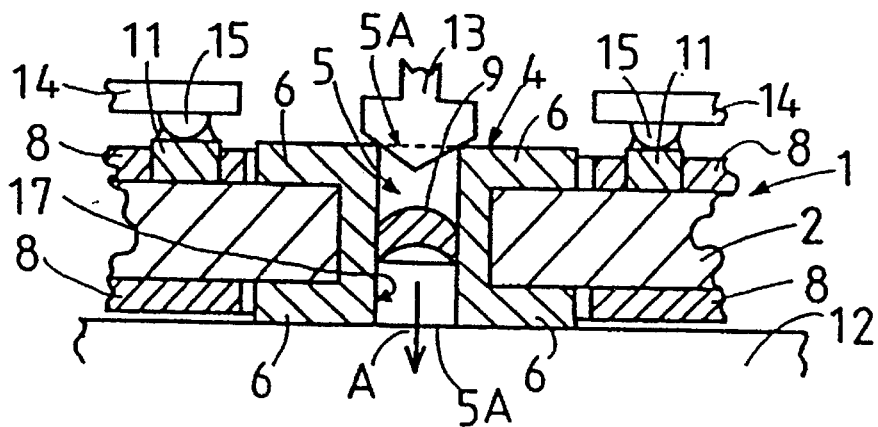
FIG. 10 is a schematic view showing an electrical check state of a circuit pattern conducted through a checker pin and a mounting state of electric components on the printed wiring board, in a fourth modification of the printed wiring board.

In the through hole 5 of the printed wiring board 1 shown in FIG. 10, the upper opening 5A is formed so as to become the same size as the lower opening 5A, thus a straight hole 17 is formed. At a substantially central position of the straight hole 17, the solder resist film 9 with an arc shape projected to the upward direction is formed, similarly to the printed wiring board 1 in FIGS. 1 and 6.

Here, when the through hole 5 is made in the straight hole 17, the wiring board as a plating objection is fluctuated when the conductive layer 4 is formed on the inner wall and the periphery of the through hole 5, in order to efficiently circulate the plating solution into the through hole 5. Airation by fine bubbles may be conducted in the plating solution. Further, addition agent such as Cupracid GS, Cupracid HL ( both are produced by ATOTECH JAPAN, K.K ) or CP-125 ( produced by JAPAN MELTEX INC. ) may be added in the plating solution.

When electrical check of the circuit patterns on the printed wiring board 1 of the fourth modification is conducted, the wiring board 1 is set on the suction device 12 with the suction means such as a vacuum pump, similarly in FIG. 6. Thereafter, the wiring board 1 is sucked in the direction indicated by the arrow A. At that time, the through hole 5 is blinded by the solder resist film 9, therefore the printed wiring board 1 is sucked and closely fixed on the suction device 12.

Here, since the solder resist film 9 is formed at the central position of the straight hole 17 and has the arc shape projected to the direction opposite to the arrowed direction indicated by the arrow A, the solder resist film 9 is deformed to the direction that the solder resist film 9 becomes flat. Therefore, the solder resist film 9 is never dropped out from the lower opening 5A while sucking by the suction device 12.

In case that electrical check of the circuit patterns on the printed wiring board 1 is conducted by the checker, the checker pin 13 is set in the upper opening 5A of the though hole 5 as shown in FIG. 10. At that time, the shape of the checker pin 13 is formed so that the top of the checker pin 13 is not contacted with the solder resist film 9. Thus, in the printed wiring board 1 of the fourth modification, electrical check of the circuit patterns thereon can be efficiently conducted by directly setting the checker pin 13 in the upper opening 5A of the through hole 5.

At the time that the electric components such as the IC chips 14 are mounted on the lands 11, solder paste is coated on each of the lands 11 while sucking and fixing the printed wiring board 1 by the suction device 12. Thereafter, the lands 11 and the solder bumps 15 formed under the IC chips 14 are precisely positioned with each other, and further reflow treatment is conducted. Based on the above process, the IC chips 14 are mounted on the lands 11. Here, each of the lands 11 on which the IC chip 14 is mounted is arranged on the side of the board 1 as same as the projected side of the solder resist film 9. In other words, the lands 11 are arranged on the side of the board 1 opposite to the side which is directed in the suction direction ( the direction indicated by the arrow A ) by the suction device 12. Therefore, there is no problem in mounting the IC chips 14 on the lands 11 while sucking the printed wiring board 1 by the suction device 12.

Next, the printed wiring board I according to the fifth modification will be described with reference to FIG. 11. In the printed wiring board i of the fifth modification, there are differences between the fifth modification and the embodiment in FIGS. 1 and 6 at the following points. That is, the first point is that the shape of the through hole 5 is formed as a straight hole 17 without the hollow portion 7 by forming the upper opening 5A so as to become the same size as the the lower opening 5A. The second point is that the solder resist film 9 has a flat shape or an arc shape projected to downward direction. The other construction of the fifth modification is as same as that of the wiring board shown in FIGS. 1 and 6. Therefore, the different points will be mainly described in the following.

Figure 11:
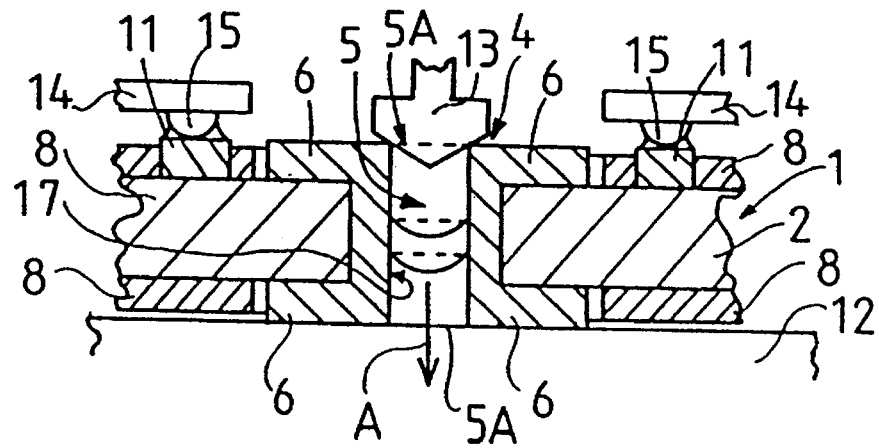
FIG. 11 is a schematic view showing an electrical check state of a circuit pattern conducted through a checker pin and a mounting state of electric components on the printed wiring board, in a fifth modification of the printed wiring board.
Figure 12:
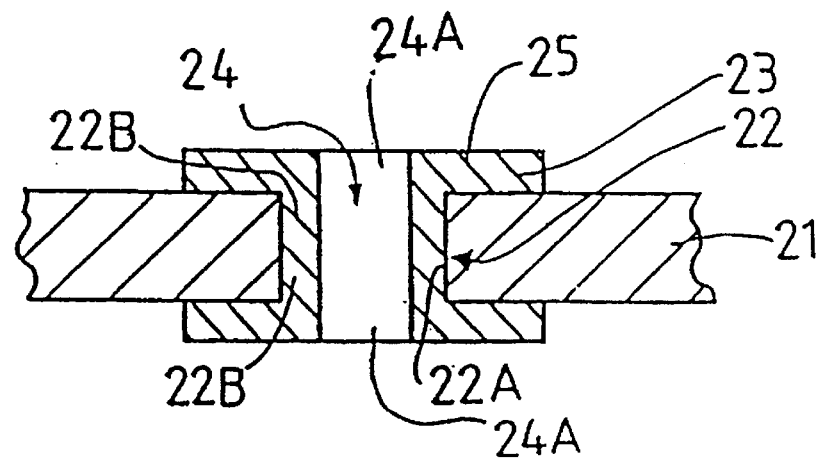
FIG. 12 is a schematic sectional view of a conventional double-sided printed wiring board showing a state before a through hole is blinded.

In the through hole 5 of the printed wiring board 1 shown in FIG. 11, the upper opening 5A is formed so as to become the same size as the lower opening 5A, thus the through hole 5 is formed as a straight hole 17. At a substantially central position of the straight hole 17, the solder resist film 9A with the flat shape ( shown in FIG. 11 as a dotted line ) is formed, similarly in FIGS. 7 and 11. Such solder resist film may be formed as a solder resist film 9B with an arc shape projected to downward direction ( shown in FIG. 11 as a solid line ).

Here, when the through hole 5 is made in the straight hole 17, the wiring board as a plating objection is fluctuated when the conductive layer 4 is formed on the inner wall and the periphery of the through hole 5, in order to efficiently circulate the plating solution into the through hole 5. Airation by fine bubbles may be conducted in the plating solution. Further, addition agent such as Cupracid GS, Cupracid HL ( both are produced by ATOTECH JAPAN, K.K ) or CP-125 ( produced by JAPAN MELTEX INC. ) may be added in the plating solution.

And it can select whether the solder resist film is formed as the film 9A with the flat shape or as the film 9B with the arc shape, by selectively changing surface tension, viscosity of the liquid composition which is composed of photosensitive resin and thermosetting resin to form the solder resist film. Such surface tension and viscosity of the liquid composition is changed by suitably changing content fraction of diluent, resin solid material or inorganic filler in the liquid composition.

When electrical check of the circuit patterns on the printed wiring board 1 of the fifth modification is conducted, the wiring board 1 is set on the suction device 12 with the suction means such as a vacuum pump, similarly in FIG. 6. Thereafter, the wiring board 1 is sucked in the direction indicated by the arrow A. At that time, the through hole 5 is blinded by the solder resist film 9A or 9B, therefore the wiring board 1 is sucked and closely fixed on the suction device 12.

Here, since the solder resist film 9A or 9B is formed at the central position of the straight hole 17, the solder resist film 9A or 9B is scarcely dropped out from the lower opening 5A while sucking by the suction device 12.

In case that electrical check of the circuit patterns on the printed wiring board 1 is conducted by the checker, the checker pin 13 is set in the upper opening 5A of the though hole 5 as shown in FIG. 11. At that time, the shape of the checker pin 13 is formed so that the top of the checker pin 13 is not contacted with the solder resist film 9A or 9B. Thus, in the printed wiring board 1 of the fifth modification, electrical check of the circuit patterns thereon can be efficiently conducted by directly setting the checker pin 13 in the upper opening 5A of the through hole 5.

At the time that the electric components such as the IC chips 14 are mounted on the lands 11, solder paste is coated on each of the lands 11 while sucking and fixing the printed wiring board 1 by the suction device 12. Thereafter, the lands 11 and the solder bumps 15 formed under the IC chips 14 are precisely positioned with each other, and further reflow treatment is conducted. Based on the above process, the IC chips 14 are mounted on the lands 11. Here, each of the lands 11 on which the IC chip 14 is mounted is arranged on the side of the board 1 opposite to the suction direction through the suction device 12 indicated by the arrow A. Therefore, there is no problem in mounting the IC chips 14 on the lands 11 while sucking the printed wiring board 1 by the suction device 12.

While the invention has been particularly shown and described with reference to preferred embodiments thereof, it will be understood by those skilled in the art that the foregoing and other changes in form and details can be made therein without departing from the spirit and scope of the invention.

For instance, the liquid composition may be composed of only photosensitive resin. And when the circuit patterns are formed on both sides of the printed wiring board 1, additive process may be utilized instead of subtractive process. Further, though the double-sided board 2 is used in the above embodiment, a multilayer printed wiring board may be utilized. Though the hollow portion 7 which is wider than both the upper and the lower openings 5A, 5A is formed when etching of the conductive layer 4 is conducted, it is conceivable that the hollow portion 7 is formed when the penetration hole 3 is formed by drilling.

What is claimed is:

1. A process for producing a printed wiring board having a board, a penetration hole formed in the board and a through hole in which a conductive layer is formed on an inner wall of the penetration hole and on both an upper and a lower peripheries of the penetration hole, the process comprising steps of:

forming the penetration hole in the board;

forming the conductive layer on the inner wall of the penetration hole and on both the upper and the lower peripheries of the penetration hole to produce the through hole;

coating liquid composition including photosensitive resin on one side of the printed wiring board thereby covering the through hole with the liquid composition so that the liquid composition partially flows into the through hole; and partially photocuring the liquid composition in the through hole by irradiating light on at least the other side of the printed wiring board; and removing the liquid composition in a non-cured state from the printed wiring board, wherein a film mainly composed of photosensitive resin is formed in the through hole so as to blind the through hole.

2. The process according to claim 1, further comprising etching the conductive layer before the coating of the liquid composition to form a hollow portion in the through hole.

3. The process according to claim 2, wherein the film is formed at the hollow portion.

4. The process according to claim 2, further comprising covering the liquid composition on the printed wiring board by a negative film with a black portion which cuts off light so that the liquid composition over the through hole is covered by the black portion before partially photocuring the liquid composition.

5. The process according to claim 4, further comprising irradiating light on the printed wiring board so as to completely photocure the film in the through hole after removal of the liquid composition in the non-cured state.

6. A check process by a checker with a suction device and a checker pin, for conducting electrical check of circuit patterns on a printed wiring board having a board, a penetration hole formed in the board, a through hole in which a conductive layer is formed on an inner wall of the penetration hole and on both an upper and a lower peripheries of the penetration hole and a film mainly composed of photosensitive resin adhered at a substantially central position of an inner wall in the through hole so that the film blinds the through hole, the process comprising:

a first step for sucking and fixing the printed wiring board onto the checker by the suction device in use of the through hole blinded by the film therein;

a second step for setting the checker pin in the through hole; and a third step for electrically checking whether the circuit patterns are broken with the checker.

* * * * *